United States Patent
Shin et al.

(10) Patent No.: US 9,401,226 B1
(45) Date of Patent: Jul. 26, 2016

(54) MRAM INITIALIZATION DEVICES AND METHODS

(71) Applicant: QUALCOMM Incorporated, San Diego, CA (US)

(72) Inventors: Hyunsuk Shin, San Diego, CA (US); Jung Pill Kim, San Diego, CA (US); Sungryul Kim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/853,860

(22) Filed: Sep. 14, 2015

(51) Int. Cl.
G11C 29/00 (2006.01)
G11C 11/16 (2006.01)
G11C 29/44 (2006.01)

(52) U.S. Cl.
CPC ............ G11C 29/76 (2013.01); G11C 11/1653 (2013.01); *G11C 29/44* (2013.01)

(58) Field of Classification Search
CPC ..... G11C 29/76; G11C 29/44; G11C 11/1653
USPC ................ 365/158, 185.02, 185.09, 200, 201
See application file for complete search history.

(56) References Cited

U.S. PATENT DOCUMENTS

| | | | |
|---|---|---|---|
| 7,587,630 B1 * | 9/2009 | Cassell | G06F 11/1088 714/47.3 |
| 8,234,545 B2 | 7/2012 | Shalvi et al. | |
| 8,423,837 B2 | 4/2013 | Madan et al. | |
| 8,479,039 B2 | 7/2013 | Edwards et al. | |
| 8,595,573 B2 | 11/2013 | Shalvi et al. | |
| 8,954,823 B2 | 2/2015 | Shalvi et al. | |
| 2013/0235644 A1 * | 9/2013 | Chung | G11C 17/16 365/103 |
| 2014/0313841 A1 * | 10/2014 | Lee | G11C 5/143 365/201 |
| 2015/0162101 A1 * | 6/2015 | Ware | G11C 29/846 714/764 |

* cited by examiner

*Primary Examiner* — Tan T. Nguyen
(74) *Attorney, Agent, or Firm* — Toler Law Group, PC (57) ABSTRACT

A device includes a redundant region of a magnetoresistive random access memory (MRAM) array that includes first memory cells. The device includes a data region of the MRAM array that includes second memory cells. The device includes a fail address region of the MRAM array, a first row of the fail address region including validity data, wherein the validity data includes multiple validity indicators, a last row indicator, or both.

30 Claims, 7 Drawing Sheets

MRAM INITIALIZATION DEVICES AND METHODS

I. FIELD

The present disclosure is generally related to magnetoresistive random access memory (MRAM) initialization.

II. DESCRIPTION OF RELATED ART

Advances in technology have resulted in smaller and more powerful computing devices. For example, a variety of portable personal computing devices, including wireless telephones such as mobile and smart phones, tablets and laptop computers, are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Certain electronic devices may include a magnetoresistive random access memory (MRAM). During manufacture and testing of the MRAM, one or more cells of a first region (e.g., a data region) of the MRAM may be determined to be defective. Such defects may be noted by blowing fuses or programming other one-time programmable devices that are coupled to the MRAM. When data is to be stored in the defective cells of the first region, the blown fuses may cause the data to instead be stored in cells of a second region (e.g., a redundant region) of the MRAM. Addresses of the second region may be mapped to addresses of the first region when the MRAM is initialized, so that requests directed to the defective cells in the first region of the MRAM are instead routed to cells in the second region of the MRAM. However, initializing the MRAM may consume processing resources, such as power and time, and may result in address mapping errors. In addition, the inclusion of one-time programmable devices, such as fuses, may increase a cost of manufacturing the MRAM.

III. SUMMARY

The present disclosure describes MRAM that stores defect information in the MRAM itself, rather than in external devices such as fuses. In accordance with the described techniques, a fail address region of an MRAM array may map addresses of defective rows of a first region (e.g., a "data region") of the MRAM array to addresses of a second region (e.g., a "redundant region") of the MRAM array. The fail address region may include validity data that indicates validity of mappings in the fail address region, a last row indicator that indicates a last row of valid data in the fail address region, or both. The MRAM array may be initialized (e.g., on power-up) by reading portions of the fail address region based on the validity indicators and the last row indicator.

In a particular aspect, a device includes a redundant region of an MRAM array that includes first memory cells. The device includes a data region of the MRAM array that includes second memory cells. The device includes a fail address region of the MRAM array, a first row of the fail address region including validity data, wherein the validity data includes multiple validity indicators, a last row indicator, or both.

In another particular aspect, a computer-readable storage device stores instructions that, when executed by a processor, cause the processor to perform operations is disclosed. The operations include identifying a mapping between a first address of a data region of an MRAM array and a second address of a redundant region of the MRAM array in response to determining that a majority of a first number of multiple copies of a fail address region of the MRAM array indicate the mapping. The operations include initializing a volatile memory based on the mapping.

In another particular aspect, a method includes reading, at a device, validity data from a first row of a fail address region of an MRAM array. The validity data includes multiple validity indicators, a last row indicator, or both. The method includes determining, based at least in part on the validity data, that a particular row of the fail address region indicates a valid mapping. The method includes identifying, at the device, a mapping between a first address of a data region of the MRAM array and a second address of a redundant region of the MRAM array based on the particular row. The method includes determining, at the device, that a majority of a first number of multiple copies of the fail address region indicate the mapping. The method includes initializing, at the device, a volatile memory based on the mapping.

In another particular aspect, an apparatus includes means for storing multiple validity indicators. A particular validity indicator of the multiple validity indicators indicates whether a particular row of a fail address region indicates a valid mapping between a corresponding first row of first memory cells of a redundant region and a second row of second memory cells of a data region. The data region, the redundant region, and the fail address region are included in an MRAM array. The apparatus includes means for identifying a mapping between a first address of the data region and a second address of a redundant region of the MRAM array based on a row of the fail address region in response to determining that the row of the fail address region indicates a valid mapping based on a validity indicator of the multiple validity indicators.

Other aspects, advantages, and features of the present disclosure will become apparent after review of the entire application, including the following sections: Brief Description of the Drawings, Detailed Description, and the Claims.

V. DETAILED DESCRIPTION

Figure 1:
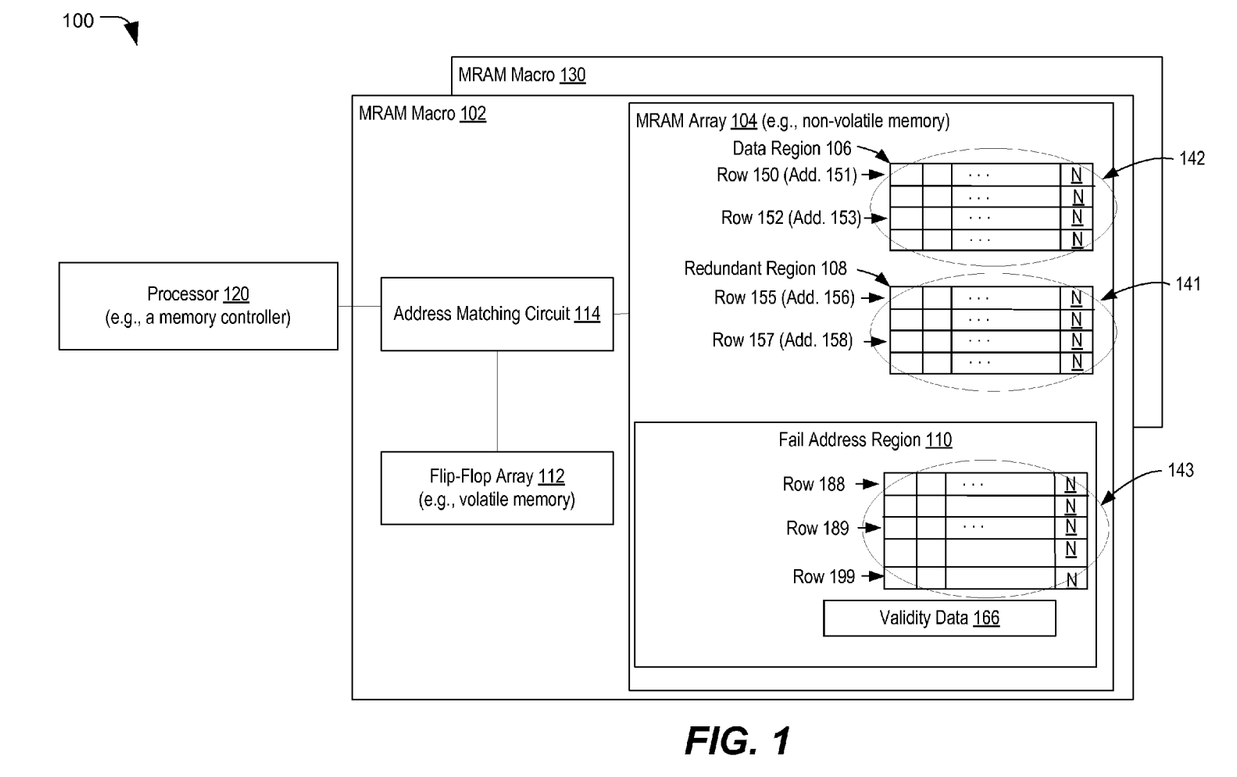
FIG. 1 is a block diagram of a particular illustrative implementation of a device that includes a fail address region.

Referring to FIG. 1, a device 100 is shown that includes a processor 120 (e.g., a memory controller) and a magnetoresistive random access memory (MRAM) macro. In a particular aspect, the device 100 may include multiple macros. For example, the device 100 may include MRAM macro (e.g., a "first MRAM macro") 102 and MRAM macro (e.g., a "second MRAM macro") 130. The MRAM macro 102 may include an MRAM array 104 (e.g., non-volatile memory), a flip-flop array 112 (e.g., volatile memory), an address matching circuit 114, or combination thereof.

The MRAM array 104 may include memory cells that are grouped into different regions. For example, the MRAM array 104 may include a redundant region 108 that includes first memory cells 141, a data region 106 that includes second memory cells 142, and a fail address region 110 that includes third memory cells 143. The first memory cells 141 may include rows of N memory cells, such as illustrative rows 155 and 157, where N is an integer greater than or equal to 1. The second memory cells 142 may include rows of N memory cells, such as illustrative rows 150 and 152. The third memory cells 143 may include rows of N memory cells, such as illustrative rows 188, 189, and 199. In alternative examples, the regions 106, 108, 110 may include different number of rows from each other and/or different numbers of memory cells per row.

As further described herein, FIG. 1 illustrates a memory management system in which non-defective rows of the data region 106 are used to store user data, rows of the redundant region 108 are used to store user data instead of defective rows of the data region 106, and rows of the fail address region 110 identify which rows of the data region 106 are defective and which rows of the redundant region 108 are mapped to (e.g., store user data on behalf of) those defective rows of the data region 106. Thus, the data region 106 may be configured to store data (e.g., user data), and the redundant region 108 may be configured to provide redundancy for the data region 106. In some examples, each of the one or more rows of the redundant region 108 may be configured to store data of a corresponding defective row of the data region 106. A row of memory cells of the data region 106 may be considered defective when memory cells of the row collectively exhibit greater than a threshold number of bit errors during testing, where the threshold number of bit errors is the number of bit errors in a row that can be corrected by available error correction mechanisms at the device 100. For example, the row 150 of the data region 106 may include one or more defective cells, and data that would have been stored in the row 150 of the data region 106 may instead be stored in the row 155 of the redundant region 108 based on determining that the row 150 is defective. It should be noted that defective rows may be detected during manufacture/testing of the MRAM macro 102 as well as during operation of the MRAM macro 102 after the device 100 has been acquired by an end-user.

When a defective row is detected in the data region 106, a row of the fail address region 110 may be modified to indicate a mapping between the defective row of the data region 106 and an address of a row of the redundant region 108. Each used (e.g., non-empty) row of the fail address region 110 may be associated with a group of memory cells of the redundant region 108 and may store or indicate an address of a corresponding defective group of memory cells of the data region 106. For example, each used (e.g., non-empty) row of the fail address region 110 may be associated with a row (or address of the row) of the redundant region 108 and may store or indicate an address of a corresponding defective row of the data region 106. In a particular aspect, associations between rows of the fail address region 110 and the redundant region 108 may be indicated in a look up table of the MRAM array 104. Alternatively, the fail address region 110 and the redundant region 108 may have the same number of rows, and rows of the regions 108, 110 having the same row index may be associated with each other.

When a particular row of the data region 106 is determined to be defective, a "next available" row of the redundant region 108 may be designated as a redundant row for the defective row of the data region 106. In addition, a corresponding "next available" row of the fail address region 110 may be used to indicate the mapping between the defective row of the data region 106 and its designated redundant row in the redundant region 108. To illustrate, prior to any defective rows being detected in the data region 106, all of the rows of the redundant region 108 and in the fail address region 110 may be "empty." The first time a row, say, the row 150, is identified as being defective, the next available row 155 of the redundant region 108 may be designated as the redundant row for the defective row 150. The corresponding next available row 188 of the fail address region 110 may store the address 151 of the defective row 150. In a particular example, the rows 188 and 155 correspond to each other because the rows both have the same row index, i.e., row index=0, within their respective regions 110, 108. Alternatively, the regions 106, 108, 110 may have different numbers of rows (e.g., a Kth row of the fail address region 110 may indicate that an Mth row of the redundant region 108 is mapped to an Nth row of the data region 106). Thus, in this example, data that would have been stored in the row 150 of the data region 106 may instead be stored in the row 155 of the redundant region 108. In general, storage of an address in an Kth row of the fail address region 110 may indicate that the corresponding Kth row of the redundant region 108 is the designated backup for the defective row in the data region 106 having that address, and that read/write operations specifying address of the defective row should be redirected (e.g., by the processor 120) to the address of the redundant row.

In some aspects, however, one or more rows of the fail address region 110 may include unreliable (e.g., invalid) mappings due to defective memory cells in the redundant region 108 or defective cells in the fail address region 110. For example, the row 157 of the redundant region 108 may be configured to store data of a defective row 152 of the data region 106. In this example, the row 189 of the fail address region 110 may be associated with the row 157 and may be configured to store or indicate the address 153 of the defective row 152. However, because the row 157 of the redundant region 108 may be defective, the row 189 of the fail address region 110 may include an unreliable mapping. Additionally or alternatively, the row 189 may itself include defective memory cell(s) and may thus be unreliable and correspond to an invalid mapping. Thus, one or more rows of the fail address region 110 may include invalid mappings due to defective memory cells in the redundant region 108 or the fail address region 110.

In a particular implementation, to enable determining whether mappings stored in the fail address region 110 are valid, one or more rows of the fail address region 110 may include validity data 166. The validity data 166 may include multiple validity indicators (e.g., one or more bits), a last row indicator, or both.

The last row indicator may indicate a last row of the fail address region 110 that includes a valid mapping. For example, the redundant region 108 may include at least one empty row of memory cells because the redundant region 108 may include more rows than are detected as defective in the data region 106, and a last row indicator 164 may indicate a last row of the fail address region 110 that includes a valid mapping. In a particular implementation, the last row indicator 164 may indicate a row index of a last row of the fail address region 110 that includes a valid mapping between an address of the redundant region 108 and an address of the data region 106. Subsequent rows of the fail address region 110 may correspond to empty/available rows of the redundant region 108. The last row of the fail address region 110 that includes a valid mapping may be distinct from the one or more rows of the fail address region 110 that include the validity data 166. To illustrate, with reference to FIGS. 2 and 3, the row 199 of the fail address region 110 may include the last row indicator 164, which, in the depicted example, indicates that row 282 (e.g., a 21$^{st}$ row of the fail address region 110) is the last row of the fail address region 110 that includes a valid mapping between an address of the redundant region 108 of FIG. 1 and an address of the data region 106. Thus, during initialization of the MRAM, as further described herein, a portion 290 of the fail address region 110 region up to the row indicated by the last row indicator 164 may be examined and the remaining rows of the fail address region 110 may be disregarded which may speed up the MRAM initialization process.

Each of the multiple validity indicators may indicate whether a corresponding row of the fail address region 110 indicates a valid mapping between an address of the data region 106 and an address of the redundant region 108. In some examples, as described in more detail below with reference to FIG. 2, each used (e.g., non-empty) row of the fail address region 110 that indicates a mapping includes a validity indicator, and each validity indicator indicates whether the row includes a valid mapping. In other examples, as described in more detail below with reference to FIG. 3, each of the validity indicators may be stored in a single row of the fail address region 110 (and remaining rows of the fail address region 110 may not include the validity indicators).

Figure 2:
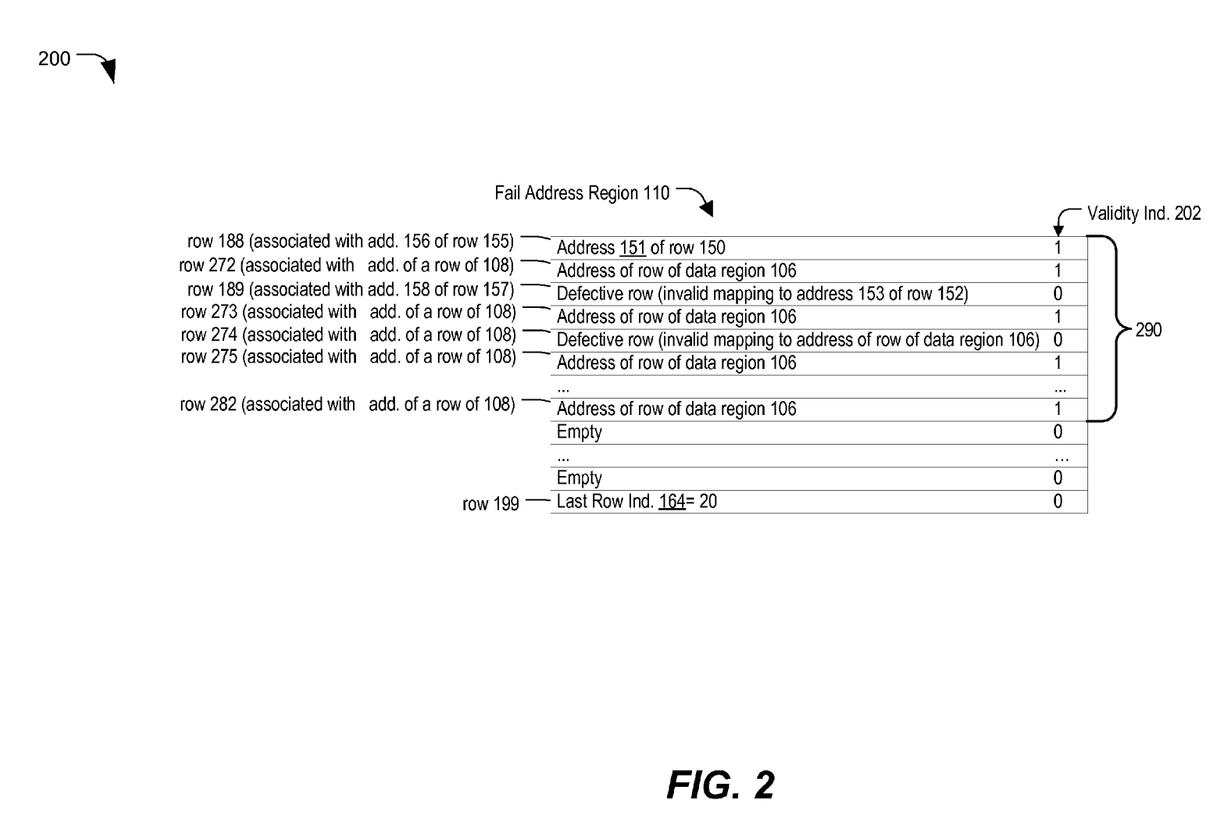
FIG. 2 is a block diagram of a particular illustrative implementation of a fail address region.

FIG. 2 illustrates a particular implementation of the fail address region 110 in which each row of the fail address region 110 includes one of multiple validity indicators 202, and is generally designated 200. As shown in FIG. 2, the row 188 of the fail address region 110 is configured to map the address 156 of the row 155 of the redundant region 108 to the address 151 of the row 150 of the data region 106, which has been determined to be defective. In this example, the row 188 of the fail address region 110 may include a first validity indicator having a first value (e.g., 1) to indicate that the row 188 includes a valid mapping between the address 156 and the address 151. Further, as shown in FIG. 2, the row 189 of the fail address region 110 is configured to map the address 158 of the row 157 of the redundant region 108 to the address 153 of the row 152 of the data region 106. However, the row 189 includes a second validity indicator having a second value (e.g., 0), indicating that the row 189 does not include a valid mapping (e.g., because the row 189 is itself defective, or because the row 157 in the redundant region is defective). During MRAM initialization, as further described herein, rows of the fail address region 110 whose validity indicators have the second value (e.g., 0) may be skipped, which may speed up the MRAM initialization process. Thus, according to the aspect illustrated in FIG. 2, each used row of the fail address region 110 may include a portion of the validity data 166, such as a validity indicator.

Figure 3:
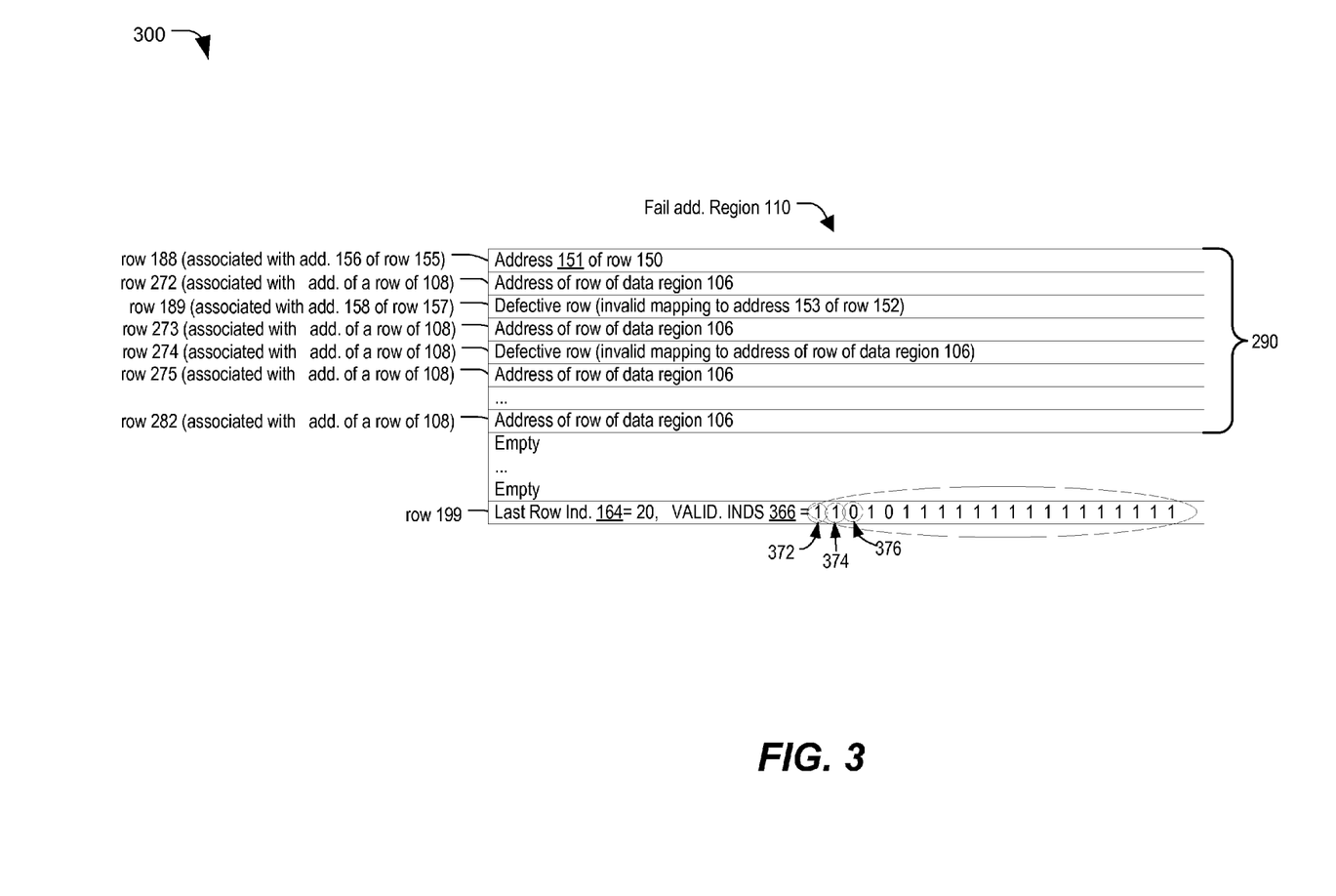
FIG. 3 is a block diagram of a particular illustrative implementation of a fail address region.

FIG. 3 illustrates a particular implementation of the fail address region 110 in which validity indicators 366 are stored in a single row (e.g., the row 199) of the fail address region 110. Each of the validity indicators 366 may indicate a validity status of a corresponding row of the fail address region 110. For example, validity indicator 372 may correspond to the row 188 and may have a first value (e.g., 1) indicating that the row 188 of the fail address region 110 includes a valid mapping. A validity indicator 374 may correspond to the row 272 and may have a first value (e.g., 1) indicating that the row 272 of the fail address region 110 includes a valid mapping. A validity indicator 376 may correspond to the row 189 of the fail address region 110 and may have a second value (e.g., 0) indicating that the row 189 does not include a valid mapping. Thus, a first row (e.g., the row 199) may include validity indicators indicating whether other rows (e.g., including a second row) of the fail address region 110 includes a valid mapping. During MRAM initialization, as further described herein, rows of the fail address region 110 whose corresponding validity indicators in the row 199 have the second value (e.g., 0) may be skipped, which may speed up the MRAM initialization process.

Returning to FIG. 1, during operation, the processor 120 may read portions of the fail address region 110 that include valid mappings to initialize (or reset) the flip-flop array 112. In a particular implementation, the processor 120 may read one or more rows of the portion 290 of the fail address region 110 that are indicated as valid and may not read one or more rows of the portion 290 of the fail address region 110 that are indicated as including an invalid mapping.

The processor 120 may be configured to determine that a row of the fail address region 110 includes a valid mapping based at least in part on determining that a row of the fail address region 110 is within a used (e.g., non-empty) portion (e.g., the portion 290) of the fail address region 110. In a particular implementation, the processor 120 may be configured to determine whether a row of the fail address region 110 is within the used portion of the fail address region 110 by comparing a row index of the row to a row index indicated by the last row indicator 164. For example, referring to FIGS. 1 and 2, the processor 120 may be configured to read the last row indicator 164 of the row 199, which may include the row index of the row 282, indicating that the row 282 is the last row of the fail address region 110 that includes a valid mapping. The processor 120 may determine that the rows 188, 272, 273, 275, and 282 may indicate a valid mapping based on the rows 188, 272, 273, 275, and 282 having a row index that is less than the row index indicated by the last row indicator 164. Thus, the processor 120 may be configured to determine that a second row of the fail address region 110 or FIGS. 2 and/or 3 indicates a valid mapping based at least in part on determining that a last row index of a last row indicated by the last row indicator is greater than or equal to a second row index of the second row.

Alternatively or additionally, the processor 120 may be configured to determine that a row of the fail address region 110 includes a valid mapping based on a validity indicator. For example, the processor 120 may determine that the rows 188, 272, 273, 275, or 282 include a valid mapping based at least in part on a value (e.g., 1) of the validity indicators 202 of FIG. 2 or 366 of FIG. 3 that correspond to the rows 188, 272, 273, 275, and 282. Alternatively or additionally, the processor 120 may determine that the rows 189 and 274 do not include a valid mapping based at least in part on a value (e.g., 0) of the validity indicators 202 of FIG. 2 and 366 of FIG. 3 that correspond to the rows 189 and 274.

The processor 120 may be configured to read rows of the fail address region 110 that are determined to include valid mappings (e.g., based on the last row indicator and/or validity data) and to skip reading rows of the fail address region 110 that are not determined to include valid mappings. Using the example above, the processor 120 may be configured to read the rows 188, 272, 273, 275, and 282 of the fail address region 110 and may be configured to forego reading the rows 189 and 274.

For each row of the fail address region 110 that is determined to include a valid mapping, the processor 120 may copy the mapping to the flip-flop array 112. For example, based on the row 188, the processor 120 may identify a mapping between the address 151 of the row 150 and the address 156 of the row 155. The processor 120 may copy the mapping between the addresses to the flip-flop array 112. The flip-flop array 112 may be used to redirect read/write commands that specify the address 151 to the address 156 instead, as further described herein.

In a particular implementation, the MRAM array 104 may include multiple (e.g., 15) copies of the fail address region 110, and the processor 120 may use majority voting among a first number of the multiple copies to initialize the flip-flop array 112. The processor 120 may determine the first number based on operating conditions (e.g., a temperature detected by a sensor included in or coupled to the MRAM macro 102), a target bit error rate (BER), or both. For example, the processor 120 may initialize the flip-flop array 112 based on a lower number (e.g., 3) of the multiple copies (e.g., copy 1, copy 7, and copy 15) when a temperature of the device 100 satisfies a threshold. Alternatively, the processor 120 may initialize the flip-flop array 112 based on a higher number (e.g., 5, 7, 9, 11, etc.) of the multiple copies when the temperature of the device 100 fails to satisfy the threshold or when reading data that is pre-loaded prior to soldering operations. Thus, the number of the multiple copies used during a majority voting may be less than all of the multiple copies and may be configurable.

Figure 4:
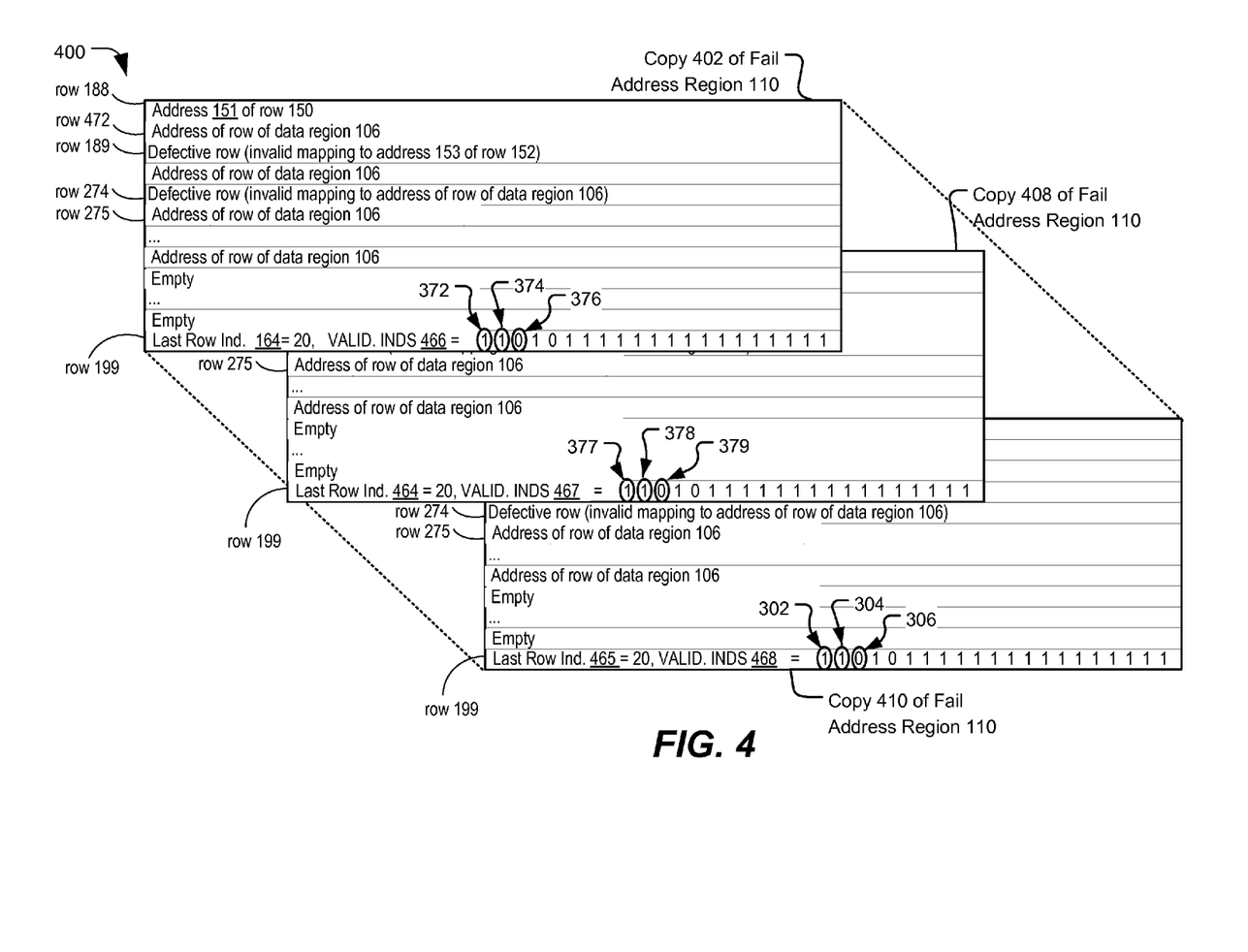
FIG. 4 is a block diagram of a particular illustrative implementation of multiple copies of a fail address region in an MRAM array.

To illustrate, FIG. 4 illustrates an example of multiple copies 400 of the fail address region 110 of FIGS. 1, 2, and/or 3. The multiple copies 400 of FIG. 4 may include fifteen copies including a first copy 402, a seventh copy 408, and a fifteenth copy 410. In some examples, each copy of the fail address region 110 of the multiple copies 400 includes validity data, a last row indicator, or both. For example, the first copy 402 may include the last row indicator 164 and the validity indicators 466, the seventh copy 408 may include the last row indicator 464 and the validity indicators 467, and the fifteenth copy 410 may include the last row indicator 465 and the validity indicators 468.

The processor 120 may determine that the first number of the multiple copies 400 corresponds to three copies (e.g., to implement "3-voting") based on an operating condition, a target bit error rate, or both. The processor 120 may determine to use the first copy 402, the seventh copy 408, and the fifteenth copy 410 as the three copies that are examined to determine the majority vote. In this example, the processor 120 may identify used (e.g., non-empty) and valid rows of the fail address region 110 of each of the first number of the multiple copies 400 by reading the last row indicators 164, 464, and 465 and the validity indicators 466, 467, and 468. For example, the validity indicators 372, 377, and 302 may be associated with the row 188 in the copies 402, 408, and 410, respectively, and may include a value (e.g., 1) indicating that the row 188 includes a valid mapping. As another example, the validity indicators 374, 378, and 304 may be associated with the row 472 in the copies 402, 408, and 410, respectively, and may include a value (e.g., 1) indicating that the row 472 includes a valid mapping. As another example, the validity indicators 376, 379, and 306 may be associated with the row 189 of the copies 402, 408, and 410, respectively, and may include a value (e.g., 0) indicating that the row 189 does not include a valid mapping.

The processor 120 may be configured to read a row (of each of the copies 402, 408, and 410) that is determined to include a valid mapping to determine an address indicated by the row of a majority of the copies 402, 408, and 410. To illustrate, the processor 120 may read the row 188 of each of the copies 402, 408, and 410. The processor 120 may determine in first and seventh copies 402 and 408, the row 188 indicates a mapping between the address 151 of the row 150 of the data region 106 and the address 156 of the row 155 of the redundant region 108, However, the row 188 in the fifteenth copy 410 may indicate a different mapping, such as due to bit error(s) causing one or more "flipped" bits in the address stored in the row 188 in the fifteenth copy 410. Based on a majority of the three copies 402, 408, and 410 of the multiple copies 400 indicating a mapping between the address 151 of the row 150 and the address 156 of the row 155, the processor 120 may store the mapping between the addresses 151, 156 in the flip-flop array 112. It will be appreciated in this example, the majority voting scheme described above preserved the mapping of the addresses 151, 156 even though the mapping had become invalid in a subset of the copies 400.

In some aspects, when one or more of the copies 400 are determined to have flipped bits in the fail address region 110, the processor 120 update such copies to correct (e.g., "scrub") the flip bits. For example, the processor 120 may update the row 188 of the fifteenth copy 410 to indicate the mapping between the addresses 151, 156. In some examples, the processor 120 may perform such "scrubbing" operations in response to determining that at least a threshold number of the copies 400 are to be scrubbed.

Once initialized, the flip-flop array 112 may be used to reroute memory accesses to defective rows of the data region 106 to rows of the redundant region 108. For example, the processor 120 (e.g., a memory controller) may receive a read access or a write access from another processor (e.g., a central processing unit (CPU)) indicating the address 151 of the row 150 of the data region 106. The address 151 of the row 150 may be provided to the address matching circuit 114. The address matching circuit 114 may access the flip-flop array 112 to determine whether a mapping for the address 151 is included in the flip-flop array 112. If not (e.g., because the row 150 has not been determined to be defective), the read or write access may be directed to the address 151 of the row 150. Conversely, if the flip-flop array 112 indicates a mapping between the address 151 and the address 156 of the row 155 of the redundant region 108, the address matching circuit 114 may direct the read or write access to the address 156 of the row 155 of the redundant region 108.

The device 100 may thus reduce errors by mapping a memory access of a defective row to a redundant row based on mappings from the fail address region 110 (which have been copied to the flip-flop array 112 during MRAM initialization, such as upon power-up). It will be appreciated that although the flip-flop array 112 may be volatile memory, the fail address region 110 is part of the MRAM array 104, which is non-volatile. The fail address region 110 may thus maintain mappings between the data region 106 and the redundant region 108, without the use of external device such as fuses, even when the device 100 is powered-down.

Figure 5:
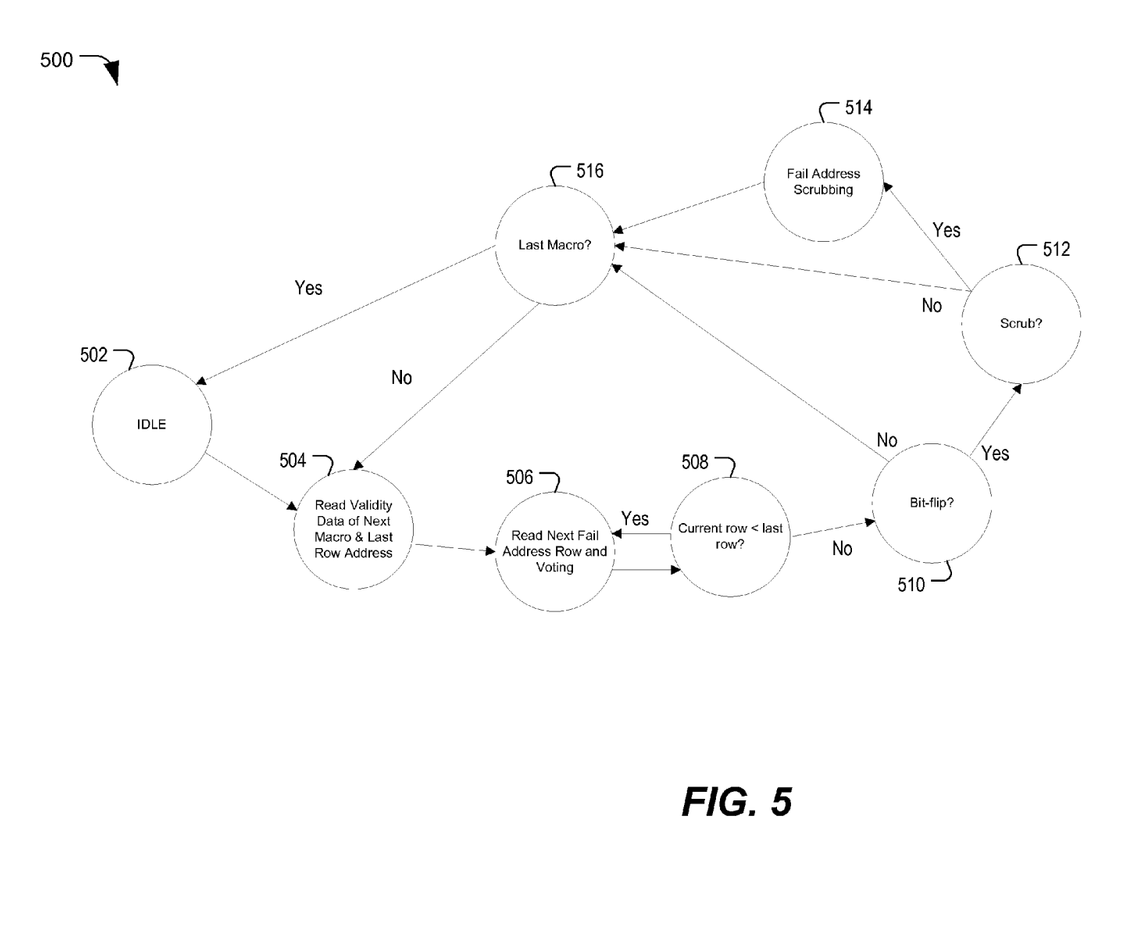
FIG. 5 is a state diagram illustrating a particular implementation of MRAM initialization using a fail address region.

FIG. 5 illustrates an example of a state diagram illustrating aspects of initializing the flip-flop array 112 of FIG. 1 using the fail address region 110. The state diagram 500 may include, at 502, the processor 120 of FIG. 1 being idle. For example, the processor 120 may be in a reduced power mode, such as a sleep mode, or may be powered off.

At 504, the processor 120 of FIG. 1 may transition to a different state (e.g., a power on state) and may read validity data of a "next" macro, such as the MRAM macro 102. In some examples, the MRAM macro 102 may include one copy of the fail address region 110, as shown in FIG. 1, 2, or 3, and the processor 120 may read the validity data from the copy to determine which rows of the fail address region 110 include valid mappings. Alternatively, the MRAM macro 102 may include multiple copies 400 of the fail address region 110, as shown in FIG. 4, and the processor 120 may read the validity data from one or more of the multiple copies 400 of the fail address region 110 to determine, using a majority voting scheme, which rows of the fail address region 110 include valid mappings.

The processor 120 of FIG. 1 may also determine, at 504, a last row of the fail address region 110 that includes a potentially valid mapping. For example, the processor 120 may read the last row indicator 164 and determine that the row 282 is the last row in the fail address region 110 that includes a potentially valid mapping. If multiple copies 400 of the fail address region 110 are present, a majority voting scheme may be used to determine the value of the last row indicator 164. As described in more detail below, the processor 120 of FIG. 1 may only read rows of the fail address region 110 that are indicated by the validity data as being valid.

At 506, the processor 120 of FIG. 1 may read a next valid row of the fail address region 110. If multiple copies 400 of the fail address region 110 are present, the processor 120 may use majority voting to determine the mapping stored in the row. The processor 120 may initialize the flip-flop array 112 with the mapping stored in the valid row. For example, as described above, the processor 120 may initialize the flip-flop array 112 to indicate a mapping between the address 151 of the row 150 of the data region 106 and the address 156 of the row 155 of the redundant region 108.

At 508, the processor 120 may determine whether the valid row of the fail address region 110 read at step 506 was the last valid row of the fail address region 110. For example, the processor 120 may compare the address of the last valid row read at 506 with the address indicated by the last row indicator 164.

When the processor 120 determines that the valid row read at 506 is not the last valid row of the fail address region 110, the processor 120 may read a next valid row of the fail address region 110. For example, the validity data 166 may indicate that the next valid row of the fail address region 110 is the row 272, and the processor 120 may read the row 272 of the first copy 402 of FIG. 4, the seventh copy 408, and the fifteenth copy 410. The processor 120 may determine the mapping with which to initialize the flip-flop array 112 based on a majority voting scheme amongst the copies 402, 408, and 410, as described above with reference to FIG. 4.

When the processor 120 determines that the valid row read at 506 is the last valid row of the fail address region 110 based on the last row indicator, the processor 120 may stop reading the fail address region 110 without reading all of the rows of the fail address region 110. Thus, the processor 120 may save power and time by initializing the flip-flop array 112 the fail address region 110 without reading all rows of the fail address region 110.

At 510, the processor 120 may determine whether to perform data scrubbing if there is a bit flip detected at one or more of the valid rows of one or more of the multiple copies of the fail address region 110. When a bit flip is detected, the processor 120 may determine, at 512, whether to perform scrubbing. For example, the processor 120 may determine whether at least a threshold number of copies of the fail address region 110 are to be scrubbed. If so, the processor 120 may, at 514, scrub the data of the one or more copies of fail address region 110 that included the bit flip(s) to correct the data. To illustrate, the processor 120 may determine that the row 188 of the fifteenth copy 410 indicates a different address than the row 188 of the first and seventh copies 402 and 408. In response, the processor 120 may scrub the data of the fifteenth copy 410 to correct the data of the row 188 of the fifteenth copy 410 to include the same address that is included in the row 188 of the first and seventh copies 402 and 408.

If bit flips were not detected or less than the threshold number of copies of the fail address region 110 were to be scrubbed, the processor may advance to 516 without performing scrubbing. At 516, the processor 516 may determine whether additional macros are to be examined. If so, the processor may advance to step 504. Otherwise, MRAM initialization may conclude the processor may transition to the idle state, at 502. Thus, the processor 120 may detect and correct mapping errors in the fail address region 110 using the majority voting scheme and without using ECC.

Figure 6:
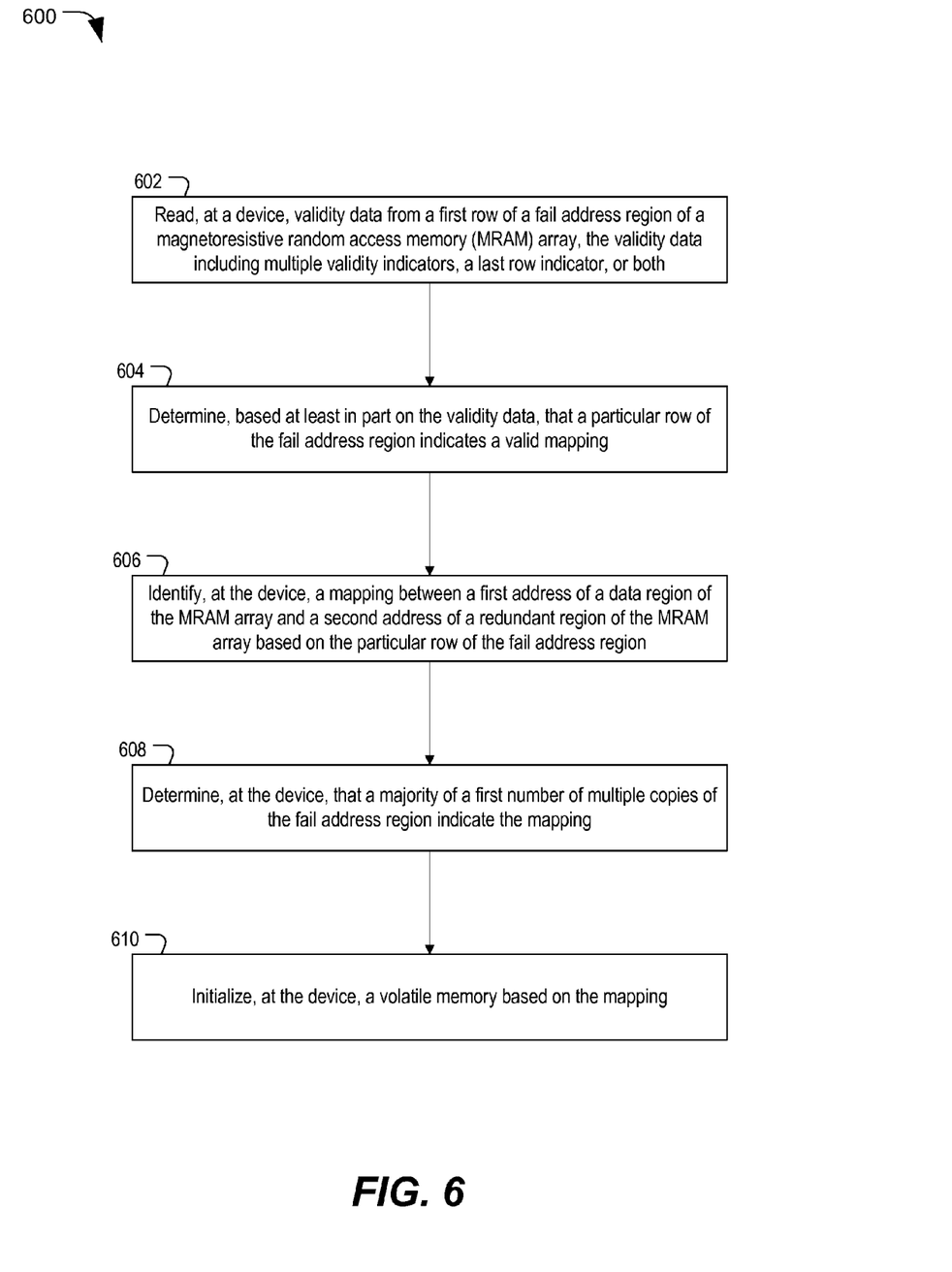
FIG. 6 illustrates a flow chart of a particular example of initializing an MRAM array using a fail address region.

FIG. 6 illustrates aspects of a method 600 of operation in accordance with the present disclosure. In an illustrative example, the method 600 may be performed at the device 100 of FIG. 1.

The method 600 includes, at 602, reading, at a device, validity data from a first row of a fail address region of an MRAM array. The validity data may include multiple validity indicators, a last row indicator, or both. For example, referring to FIG. 1, the processor 12 may read the validity data 166 from the fail address region 110, where the validity data 166 may include the validity indicators 202, the validity indicators 366, the validity indicators 466, the validity indicators 467, and/or the validity indicators 468.

The method 600 includes, at 604, determining that a particular row of the fail address region indicates a valid mapping. For example, referring to FIG. 2, the row 188 may be determined to indicate a valid mapping based on an index of the row 188 being less than the last row indicator 164 and based on the validity indicator of the last row 188 having a first value (e.g., 1). As another example, referring to FIG. 3, the row 188 may be determined to indicate a valid mapping based on an index of the row 188 being less than the last row indicator 164 and based on the validity indicator 372 having the first value (e.g., 1). As yet another example, when multiple copies 400 of the fail address region 110 are present, the row 188 may be determined to indicate a valid mapping based on a majority voting scheme, as described with reference to FIG. 4.

The method 600 includes, at 606, identifying a mapping between a first address of a data region of the MRAM array and a second address of a redundant region of the MRAM array based on the particular row of the fail address region. For example, the processor 120 may determine, based on the row 188, that address 151 of the row 150 in the data region 106 is mapped to the address 156 of the row 155 of the redundant region 108. If multiple copies 400 of the fail address region 110 are present, the processor 120 may determine the mapping based on a majority voting scheme, as described with reference to FIG. 4. For example, continuing to 608, the method 600 includes determining that a majority of the first number of copies of the fail address region 110 indicate the mapping. For example, as described with reference to FIG. 4, the processor 120 may determine that the row 188 of the first and seventh copies 402 and 408 indicate that the address 151 is mapped to the address 156, while the row 188 of the fifteenth copy 410 indicates a different mapping. The number of copies that constitute a majority and/or that are examined to determine a majority may be based on operating conditions at the MRAM array 104, such as temperature and whether the mapping is for pre-loaded data prior to soldering operations being performed the MRAM array, as illustrative non-limiting examples. It should be noted that although the preceding example describes determining the address stored in a row of the fail address region 110 based on majority voting, other data may be determined using majority voting as well. For example, the value of a last row indicator, the value of a validity indicator, user data stored in a particular row of the redundant region 108, etc., may also be determined based on a majority voting scheme in particular implementations.

The method 600 includes, at 610, initializing a volatile memory based on the mapping. For example, the processor 120 may initialize the flip-flop array 112 based on the mapping indicated by the majority of the first number of the copies. To illustrate, the processor 120 may initialize the flip-flop array 112 to indicate that the address 151 of the row 150 of the data region 106 is mapped to the address 156 of the row 155 of the redundant region 108 based on the majority of the first number of the multiple copies 400 indicating the mapping. The method 600 may be continued for additional rows of the fail address region 110 and for additional MRAM macros (e.g., a different flip-flop array 112 may be initialized for each of multiple MRAM macros in a device, such as the device 100).

Figure 7:
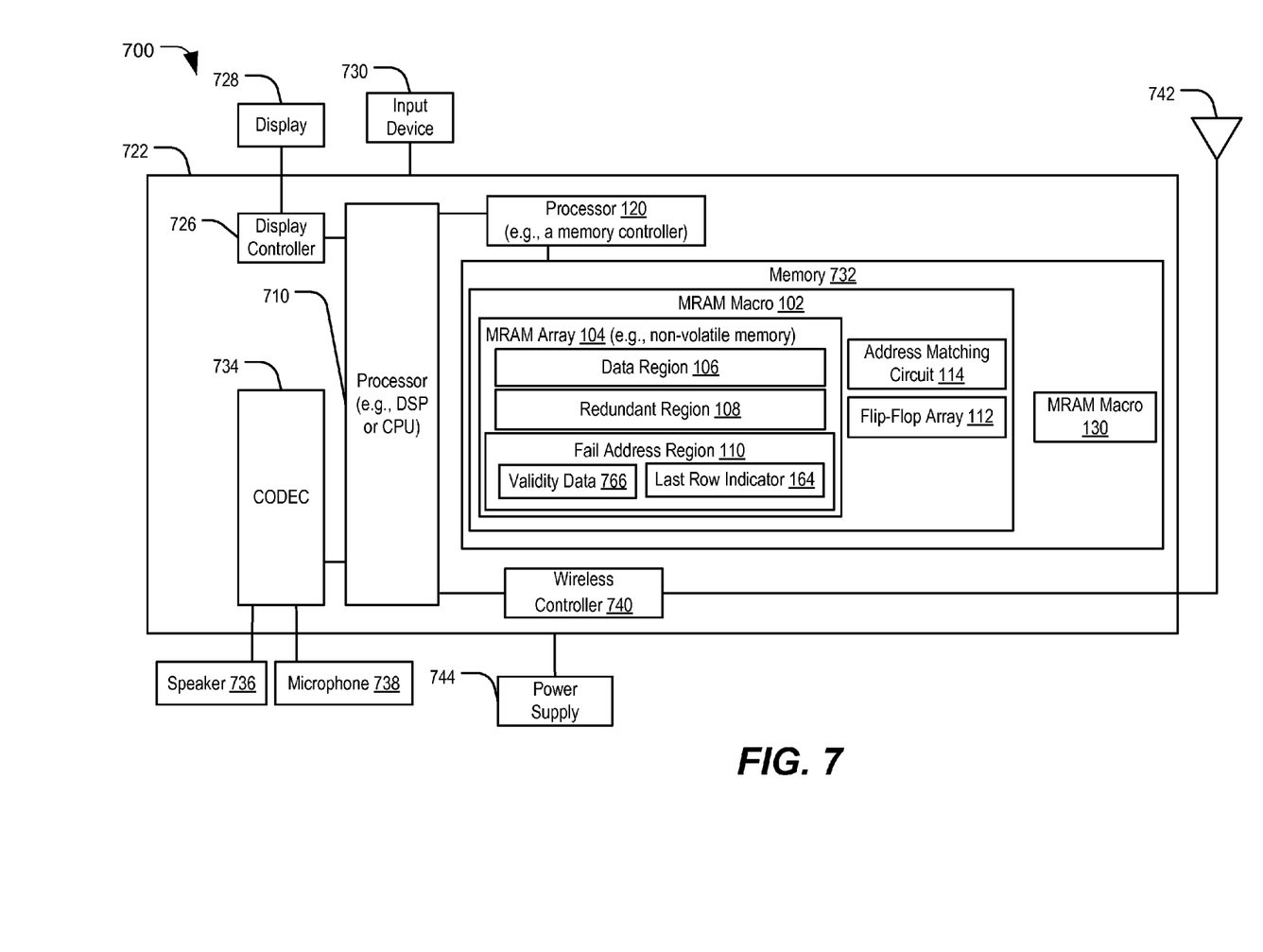
FIG. 7 is a block diagram of portable device including an MRAM array that includes a fail address region.

Referring to FIG. 7, a block diagram of a particular illustrative example of a wireless communication device is depicted and generally designated 700. The wireless communication device 700 includes a processor 710, such as a digital signal processor (DSP) or a CPU, coupled to a memory 732 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). For example, the memory 732 may include one or more MRAM macros and one or more MRAM arrays. To illustrate, the memory 732 may include the MRAM macro 102 and the MRAM macro 130, and the MRAM macro 102 may include the MRAM array 104. The MRAM array 104 may include the data region 106, the redundant region 108, and one or more copies of the fail address region 110. For example, the MRAM array 104 may include one copy of the fail address region 110 or may include the multiple copies 400 of FIG. 4 of the fail address region 110. The fail address region 110 of each of the one or more copies 400 may include validity data 766, the last row indicator 164, or both. The validity data 766 may include the validity indicators 202, the validity indicators 366, the validity indicators 466, the validity indicators 467, and/or the validity indicators 467. In an illustrative example, the processor 120 may initialize the flip-flop array 112 according to all or a portion of the state diagram 500 of FIG. 5, the method 600 of FIG. 6, or any combination thereof. For example, the processor 120 may initialize the flip-flop array 112 with mappings between addresses of defective rows of the data region 106 to addresses of rows of the redundant region 108 based on valid mappings in the fail address region 110 (or in a majority of the multiple copies 400 of the fail address region 110).

The processor 120 may be coupled to the MRAM array 104 in the memory 732 to enable identifying mappings and to initialize the flip-flop array 112. For example, the memory 732 may be a non-transitory computer-readable medium (e.g., a computer-readable storage device) storing computer-executable instructions that are executable by the processor 120 to cause the processor 120 to perform operations. The operations may include identifying a mapping between an address of the data region 106 and an address of the redundant region 108. For example, when executed by the processor 120, the instructions may cause the processor 120 to read rows of a first number of the multiple copies 400 of FIG. 4 of the fail address region 110 that are indicated by the validity data 766 as including valid mappings as described above with reference to FIGS. 1-6. The operations may further include determining the first number of the multiple copies based on operating conditions, a target bit error rate, or both, as described above. The processor 120 may use a majority voting scheme to select an address as described above with reference to FIGS. 1-6. The operations may further include initializing the flip-flop array 112 as described above with reference to FIGS. 1-6.

The operations may further include determining that a subset of the multiple copies 400 of FIG. 4 of the fail address region 110 do not indicate a mapping indicated by a majority of the first number of the multiple copies 400 of FIG. 4 of the fail address region 110 (e.g., the subset include bit flips). The operations may further include updating (e.g., scrubbing) the subset of the multiple copies 400 of FIG. 4 to indicate the mapping indicated by the majority of the first number of the multiple copies as described above with reference to FIGS. 1-4. In some examples, the operations may include updating the subset of the multiple copies when the first number of the multiple copies satisfies a threshold. In these examples, the operations may further include determining that the first number of copies satisfies (e.g., exceeds) the threshold.

FIG. 7 also shows a display controller 726 that is coupled to the processor 710 and to a display 728. A coder/decoder (CODEC) 734 may also be coupled to the processor 710. A speaker 736 and a microphone 738 may be coupled to the CODEC 734.

FIG. 7 also indicates that a wireless controller 740 may be coupled to the processor 710 and may be further coupled to an antenna 742. In a particular implementation, the processor 710, the display controller 726, the memory 732, the CODEC 734, and the wireless controller 740 are included in a system-in-package or system-on-chip device 722. In a particular implementation, an input device 730 and a power supply 744 are coupled to the system-on-chip device 722. Moreover, in a particular implementation, as illustrated in FIG. 7, the display 728, the input device 730, the speaker 736, the microphone 738, the antenna 742, and the power supply 744 are external to the system-on-chip device 722. However, each of the display 728, the input device 730, the speaker 736, the microphone 738, the antenna 742, and the power supply 744 may be coupled to a component of the system-on-chip device 722, such as an interface or a controller.

In conjunction with the described aspects, examples, and implementations, a system is disclosed that may include means for storing multiple validity indicators, such as the fail address region 110 of FIGS. 1-4 (or the multiple 400 copies thereof). The validity indicators may correspond to the validity data 166 of FIG. 1, the validity indicators 202 of FIG. 2, the validity indicators 366 of FIG. 3, and/or one or more of the validity indicators 466-468 of FIG. 4. In some examples, a particular validity indicator of the multiple validity indicators indicates whether a particular row of the fail address region 110 indicates a valid mapping between a corresponding first row of memory cells of the redundant region 108 and a second row of second memory cells of the data region 106.

The system may further include means for identifying a mapping between a first address of the data region and a second address of the redundant region of the MRAM array 104 based a row of the fail address region 110 in response to determining that the row of the fail address region indicates a valid mapping based on a validity indicator of the multiple validity indicators. For example, the means for identifying a mapping may correspond to the processor 120, which may be configured to read the fail address region 110 to identify the mapping. For example, the means for identifying the mapping may be configured to read the fail address region 110, perform a majority voting determination as described above, and select a mapping based on the address indicated by the majority voting determination.

The means for storing and the means for identifying may, in particular aspects, be integrated into at least one of a communications device, a fixed location data unit, a mobile location data unit, a mobile phone, a cellular phone, a satellite phone, a computer, a tablet, a portable computer, a desktop computer, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, or a portable digital video player.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices.

Although one or more of FIGS. 1-7 may illustrate systems, devices, and/or methods according to the teachings of the disclosure, the disclosure is not limited to these illustrated systems, devices, and/or methods. Aspects, examples, and implementations of the disclosure may be suitably employed in any device that includes integrated circuitry including memory, a processor, and on-chip circuitry.

One or more functions or components of any of FIGS. 1-7 as illustrated or described herein may be combined with one or more other portions of another of FIGS. 1-7. Accordingly, no single aspect, example, or implementation described herein should be construed as limiting and aspects, examples, and implementations of the disclosure may be suitably combined without departing form the teachings of the disclosure.

Those of skill would further appreciate that the various illustrative logical blocks, configurations, modules, circuits, and algorithm steps described in connection with the aspects, examples, and implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects, examples, and implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal A storage device is not a signal.

The previous description of the disclosed aspects, examples, and implementations is provided to enable a person skilled in the art to make or use the disclosed aspects, examples, and implementations. Various modifications to these aspects, examples, and implementations will be readily apparent to those skilled in the art, and the principles defined herein may be applied to other aspects, examples, and implementations without departing from the scope of the disclosure. Thus, the present disclosure is not intended to be limited to the aspects, examples, and implementations shown herein but is to be accorded the widest scope possible consistent with the principles and novel features as defined by the following claims.

What is claimed is:

1. A device comprising:
   a redundant region of a magnetoresistive random access memory (MRAM) array that includes first memory cells;
   a data region of the MRAM array that includes second memory cells; and
   a fail address region of the MRAM array, a first row of the fail address region including validity data, wherein the validity data includes multiple validity indicators, a last row indicator, or both.

2. The device of claim 1, wherein the validity data includes the multiple validity indicators.

3. The device of claim 2, wherein a particular row of the fail address region corresponds to a first group of the first memory cells, wherein the particular row stores an address of a second group of the second memory cells, wherein a particular validity indicator of the multiple validity indicators indicates whether a mapping indicated by the particular row between the first group of the first memory cells and the second group of the second memory cells is valid.

4. The device of claim 1, wherein the validity data includes the last row indicator.

5. The device of claim 4, wherein a second row of the fail address region corresponds to a first group of the first memory cells, wherein the second row stores an address of a second group of the second memory cells, wherein the second row indicates a mapping between the first group of the first memory cells and the second group of the second memory cells, and wherein the last row indicator indicates that the second row is a last row of the fail address region that indicates a valid mapping.

6. The device of claim 4, further comprising a processor configured to determine that a second row of the fail address region indicates a valid mapping based at least in part on determining that a last row index of a last row indicated by the last row indicator is greater than or equal to a second row index of the second row.

7. The device of claim 1, further comprising a processor configured to determine that a second row of the fail address region indicates a valid mapping based on a validity indicator.

8. The device of claim 1, further comprising a processor configured to, in response to determining that a second row of the fail address region indicates a valid mapping based at least in part on the validity data, identify a mapping between a first address of the data region and a second address of the redundant region based on the second row.

9. The device of claim 8, wherein the mapping is identified in response to determining that a majority of a first number of multiple copies of the fail address region indicate the mapping.

10. The device of claim 8, wherein the processor is further configured to, in response to determining that a subset of multiple copies of the fail address region do not indicate the mapping, update the subset of the multiple copies to indicate the mapping.

11. A computer-readable storage device storing instructions that, when executed by a processor, cause the processor to perform operations comprising:
identifying a mapping between a first address of a data region of a magnetoresistive random access memory (MRAM) array and a second address of a redundant region of the MRAM array in response to determining that a majority of a first number of multiple copies of a fail address region of the MRAM array indicate the mapping; and
initializing a volatile memory based on the mapping.

12. The computer-readable storage device of claim 11, wherein a first row of the fail address region includes validity data, wherein the validity data includes multiple validity indicators, a last row indicator, or both.

13. The computer-readable storage device of claim 12, wherein the mapping is identified based on a second row of the fail address region in response to determining, based at least in part on the validity data, that the second row indicates a valid mapping.

14. The computer-readable storage device of claim 12, wherein the validity data includes the last row indicator, wherein the mapping is identified based on a second row of the fail address region in response to determining that a last row index of a last row indicated by the last row indicator is greater than or equal to a second row index of the second row and that a validity indicator indicates that the second row indicates a valid mapping.

15. The computer-readable storage device of claim 11, wherein the operations further comprise, in response to determining that a subset of the multiple copies does not indicate the mapping, updating the subset of the multiple copies to indicate the mapping.

16. The computer-readable storage device of claim 11, wherein, subsequent to initialization, an access to the first address of the data region is mapped to the second address of the redundant region based on the volatile memory.

17. The computer-readable storage device of claim 11, wherein the operations further comprise determining the first number based on operating conditions, a target bit error rate, or both.

18. The computer-readable storage device of claim 11, wherein the operations further comprise, in response to determining that the first number satisfies a threshold and that a subset of the multiple copies does not indicate the mapping, updating the subset of the multiple copies to indicate the mapping.

19. A method of memory initialization comprising:
reading, at a device, validity data from a first row of a fail address region of a magnetoresistive random access memory (MRAM) array, the validity data including multiple validity indicators, a last row indicator, or both;
determining, based at least in part on the validity data, that a particular row of the fail address region indicates a valid mapping;
identifying, at the device, a mapping between a first address of a data region of the MRAM array and a second address of a redundant region of the MRAM array based on the particular row;
determining, at the device, that a majority of a first number of multiple copies of the fail address region indicate the mapping; and
initializing, at the device, a volatile memory based on the mapping.

20. The method of claim 19, wherein each validity indicator of the multiple validity indicators indicates whether a corresponding row of the fail address region indicates a valid mapping between a first group of memory cells of the data region and a second group of memory cells of the redundant region.

21. The method of claim 19, wherein the last row indicator indicates a last row of the fail address region that indicates a valid mapping between a first group of first memory cells of the redundant region and a second group of second memory cells of the data region, and wherein the first row is distinct from the last row.

22. The method of claim 19, further comprising determining that the particular row of the fail address region indicates the valid mapping based at least in part on determining that a last row index of a last row indicated by the last row indicator is greater than or equal to a second row index of the particular row.

23. The method of claim 19, further comprising determining that the particular row of the fail address region indicates the valid mapping based on a validity indicator.

24. The method of claim 23, wherein the multiple validity indicators include the validity indicator or the particular row includes the validity indicator.

25. The method of claim 19, further comprising, in response to determining that the first number satisfies a threshold and that a subset of the multiple copies of the fail address region do not indicate the mapping, updating the subset of the multiple copies of the fail address region to indicate the mapping.

26. The method of claim 19, wherein the first number is based on a detected temperature.

27. The method of claim 19, wherein the first number is based on a target bit error rate.

28. The method of claim 19, wherein, subsequent to initialization, an access to the first address of the data region is mapped to the second address of the redundant region based on the volatile memory, and wherein the access includes a read access or a write access.

29. An apparatus comprising:
means for storing multiple validity indicators, a particular validity indicator of the multiple validity indicators indicating whether a particular row of a fail address region indicates a valid mapping between a corresponding first row of first memory cells of a redundant region and a second row of second memory cells of a data region, wherein the data region, the redundant region, and the fail address region are included in a magnetoresistive random access memory (MRAM) array; and
means for identifying a mapping between a first address of the data region and a second address of a redundant region of the MRAM array based on a row of the fail address region in response to determining that the row of the fail address region indicates a valid mapping based on a validity indicator of the multiple validity indicators.

30. The apparatus of claim 29, wherein the means for storing and the means for identifying are integrated into at least one of a communications device, a fixed location data unit, a mobile location data unit, a mobile phone, a cellular phone, a satellite phone, a computer, a tablet, a portable computer, a desktop computer, a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, or a portable digital video player.

* * * * *